(12) United States Patent
Zou et al.

(10) Patent No.: US 10,264,363 B2
(45) Date of Patent: Apr. 16, 2019

(54) MEMS MICROPHONE WITH IMPROVED SENSITIVITY

(71) Applicant: TDK Corporation, Minato-ku, Tokyo (JP)

(72) Inventors: Lei Zou, København S (DK); Gino Rocca, Copenhagen (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/554,647

(22) PCT Filed: Mar. 24, 2015

(86) PCT No.: PCT/EP2015/056251
§ 371 (c)(1),
(2) Date: Aug. 30, 2017

(87) PCT Pub. No.: WO2016/150487
PCT Pub. Date: Sep. 29, 2016

(65) Prior Publication Data
US 2018/0041841 A1     Feb. 8, 2018

(51) Int. Cl.
*H04R 19/04*     (2006.01)
*H04R 19/00*     (2006.01)
*B81B 7/00*     (2006.01)
*H04R 3/00*     (2006.01)

(52) U.S. Cl.
CPC .......... *H04R 19/04* (2013.01); *B81B 7/0087* (2013.01); *H04R 3/00* (2013.01); *H04R 19/005* (2013.01); *B81B 2201/0257* (2013.01); *B81B 2207/012* (2013.01); *H04R 2201/003* (2013.01)

(58) Field of Classification Search
CPC ........ H04R 19/04; H04R 3/00; H04R 19/005; H04R 2201/003; B81B 7/0087; B81B 2201/0257; B81B 2207/012
USPC ......................................... 381/113
See application file for complete search history.

(56) References Cited

U.S. PATENT DOCUMENTS

| | | | | |
|---|---|---|---|---|
| 5,168,174 A | * | 12/1992 | Naso ....................... | G11C 16/30 327/536 |
| 2003/0155978 A1 | * | 8/2003 | Pehlke .................... | H03F 1/025 330/296 |
| 2006/0147061 A1 | | 7/2006 | Niwa et al. | |
| 2010/0301832 A1 | * | 12/2010 | Katyal ..................... | G05F 3/30 323/314 |

(Continued)

FOREIGN PATENT DOCUMENTS

| | | |
|---|---|---|
| JP | 2010-233102 A | 10/2010 |
| JP | 2017-517944 A | 6/2017 |
| WO | 2011/001195 A1 | 1/2011 |

OTHER PUBLICATIONS

PCT Search Report corresponding to co-pending PCT Patent Application No. PCT/EP2015/056251, European Patent Office, dated Dec. 4, 2015; (3 pages).

(Continued)

*Primary Examiner* — William A Jerez Lora
(74) *Attorney, Agent, or Firm* — Nixon Peabody LLP

(57) ABSTRACT

A MEMS microphone with an improved sensitivity, e.g., a reduced temperature dependence of the sensitivity. The microphone includes a MEMS capacitor, a charging circuit and a bias circuit. The bias circuit includes a closed loop control circuit and creates a bias voltage with a temperature dependence.

15 Claims, 5 Drawing Sheets

(56) References Cited

U.S. PATENT DOCUMENTS

Figure 1:
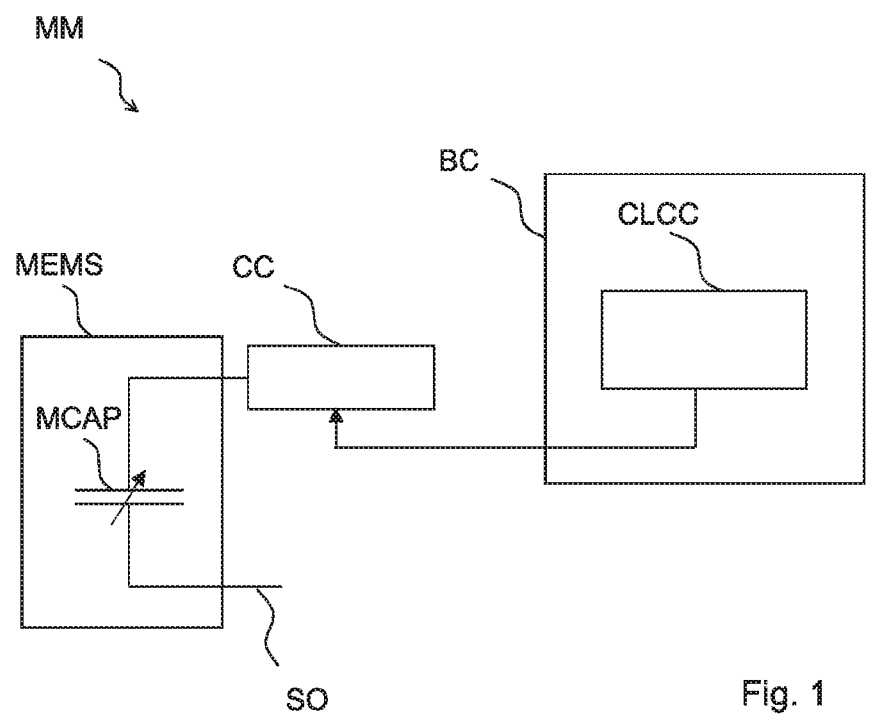

| | | | |
|---|---|---|---|
| 2011/0018616 A1* | 1/2011 | Li ........................ | H02M 3/073 327/536 |
| 2011/0234293 A1* | 9/2011 | Shanan .................. | H03B 19/00 327/361 |
| 2013/0200954 A1 | 8/2013 | Li et al. | |
| 2015/0348905 A1* | 12/2015 | Tsai .................. | H01L 21/76898 257/774 |
| 2016/0134295 A1* | 5/2016 | Kris ........................ | G06F 1/022 341/144 |
| 2016/0175612 A1* | 6/2016 | Kazic .................. | A61N 5/0624 606/3 |
| 2017/0188145 A1 | 6/2017 | Rocca | |

OTHER PUBLICATIONS

PCT Written Opinion corresponding to co-pending PCT Patent Application No. PCT/EP2015/056251, European Patent Office, dated Dec. 4, 2015; (5 pages).

* cited by examiner

MEMS MICROPHONE WITH IMPROVED SENSITIVITY

CROSS-REFERENCE TO RELATED APPLICATIONS

This application is a U.S. National Stage of International Application No. PCT/EP2015/056251, filed Mar. 24, 2015, which is incorporated herein by reference in its entirety.

The present invention refers to MEMS microphones with improved sensitivity, e.g. to MEMS microphones with a reduced temperature dependence of its sensitivity.

MEMS microphones comprise a MEMS capacitor with a variable capacitance where variances in capacitance reflect a received audio signal. Further, MEMS microphones comprise electrical and electronic circuitry in an ASIC (Application-Specific Integrated Circuit). To protect the MEMS capacitor and the circuitry in the ASIC in an ASIC chip from negative environmental influences, a MEMS microphone comprises packaging components. The MEMS capacitor, the ASIC and the influence of the packaging components on the signal of the MEMS microphone are subject to temperature-induced variations in electrical properties. In particular, an increase in temperature deteriorates the microphone signal quality and due to the complex construction of the microphone, the individual contributions of the microphone's components to the total deterioration is complex, too.

Thus, what is needed is a MEMS microphone with improved signal quality, especially with improved sensitivity, e.g. with a reduced or eliminated temperature dependence of the sensitivity.

MEMS microphones or components of such microphones improving the signal quality are known, e.g. from U.S. Pat. No. 7,889,030, US 2011/0200212, U.S. Pat. No. 8,067,992.

However, improvements in sensitivity appear still possible.

A MEMS microphone according to independent claim 1 provides a microphone with improved sensitivity. The dependent claims provide preferred embodiments.

A MEMS microphone comprises a MEMS capacitor with a variable capacitance, a charging circuit provided for charging the MEMS capacitor, and bias circuit provided for creating a bias voltage applied to the charging circuit. The bias circuit comprises a closed loop control circuit. The bias voltage applied to the charging circuit has a temperature dependence.

The closed loop control circuit of the bias circuit, thus provides a temperature dependent bias voltage that controls the charging circuit.

It was found that different MEMS microphones have different temperature dependent sensitivity curves that describe the temperature induced deterioration of the sensitivity of a microphone. As explained above, the temperature induced deterioration of a complex microphone depends on a plurality of factors working together in a complex manner. Technical means eliminating one of the plurality of factors may improve a microphone signal quality. However, even such an improved microphone still has a temperature dependence of its sensitivity.

However, with the present microphone, the temperature dependence of the bias voltage may result in a MEMS microphone with practically no temperature dependent sensitivity, even in a wide temperature range.

As the sensitivity of a MEMS capacitor in the MEMS microphone is mainly proportional to the electrical voltage applied to the MEMS capacitor, the control of the voltage of the capacitor—which is fed by a charging circuit—allows to compensate a temperature induced sensitivity deterioration of the whole microphone without the need of compensating each of the microphone's components individually.

The closed loop control circuit of the bias circuit controlling the charging circuit—and thus controlling the voltage applied to the MEMS capacitor—may monitor regularly the operation temperature of the microphone and adaptively compensate a temperature induced deterioration by selecting the optimal bias voltage.

It is possible that the bias voltage has a piece-wise linear temperature dependence.

The complex temperature dependent sensitivity of a microphone may be approximated by piece-wise linear segments over a wide temperature range. The number of segments may be chosen to obtain a temperature compensation that fulfills the needed requirements. The temperature intervals defining the segments are represented by threshold temperatures. The threshold temperatures may be chosen at small temperature differences when the temperature dependent sensitivity has larger slopes. The segments can be wider if the temperature dependent sensitivity has a mainly small slope. Thus, with a small number of segments of a piece-wise linear approximation of the temperature dependent sensitivity, a corresponding set of piece-wise linear bias voltages having the same threshold temperatures can be obtained for providing a temperature compensated MEMS microphone with an improved sensitivity over a wide temperature range without the need for compensating the contributions of the individual components of the microphone.

It is possible that the MEMS microphone comprises a temperature sensor. The temperature sensor may be part of the closed loop control circuit of the bias circuit.

It is possible that the temperature sensor provides a temperature signal that is proportional to the absolute temperature. Such a temperature signal may be a PTAT voltage $V_{sin}$ (PTAT=Proportional To Absolute Temperature).

Such a voltage is well suited to be utilized by circuit components of the closed loop control circuit having a relatively simple circuit topology.

It is possible that the closed loop control circuit comprises a slope generator. The slope generator may produce the slope of the bias voltage at a given operation temperature, e.g. within a temperature interval if a bias circuit providing a piece-wise linear temperature dependence is utilized.

It is possible that the slope generator comprises a comparator and a plurality of serial connections of a resistor and a switch.

The resistor can have a variable resistance. By setting the resistances of the resistors of the slope generator, the temperature dependence of the bias voltage can be modeled to provide a temperature compensated microphone. Especially, the resistance of the respective resistor can be chosen to determine the corresponding slope of a segment of the piece-wise linear temperature dependence of the bias voltage.

It is possible that the closed loop control circuit comprises a slope control circuit controlling the slope generator. The slope control circuit may provide the slope generator with a signal or a plurality of signals informing the slope generator about the actual temperature or about the actual temperature range or temperature interval.

It is possible that the slope control circuit comprises a plurality of comparators.

Each of the comparators of the slope control circuit may be directly connected to one of the switches of the plurality of serial connections of the slope generator.

It is possible that the charging circuit comprises a charge pump. The charge pump may be a conventional charge pump such as a Dickson charge pump.

It is possible that the slope generator generates a voltage $V_{sg}$ linear over temperature. Further, the slope of $V_{sg}$ is mainly proportional to the negative slope of the temperature dependence of the sensitivity of the microphone, $-S(t)$, at a given temperature or within a given temperature interval.

The PTAT voltage $V_{sg}$ generated by the slope generator reflects the amount of sensitivity deterioration and provides the corresponding countermeasure as it is responsible for the according additional electrical charge transferred to the MEMS capacitor.

The PTAT voltage $V_{sg}$ may—in addition to another offset voltage—establish the bias voltage conducted to the charging circuit.

It is possible that the bias voltage is the sum of a plurality of voltages selected from temperature independent voltages and temperature dependent voltages.

It is further possible that the MEMS microphone comprises an ASIC where the bias circuit is a part of the ASIC and at least partially arranged in an ASIC chip.

It is further possible that the MEMS microphone additionally comprises a non-volatile memory element for storing linearity parameters.

The linearity parameters may encode the resistances of the resistors having a variable resistance of the slope generator. The precise values of the resistances may be transferred in a one-time programming step into the microphone and determined in a calibration process after manufacturing the microphone.

The calibration process may comprise the steps of increasing the operation temperature of the microphone and simultaneously monitoring the temperature dependent sensitivity of the microphone. The temperature dependent sensitivity may be approximated by a piece-wise linear curve and the linearity parameters may be directly obtained by inverting the sine of the slope of the piece-wise linear segments.

Figure 2:
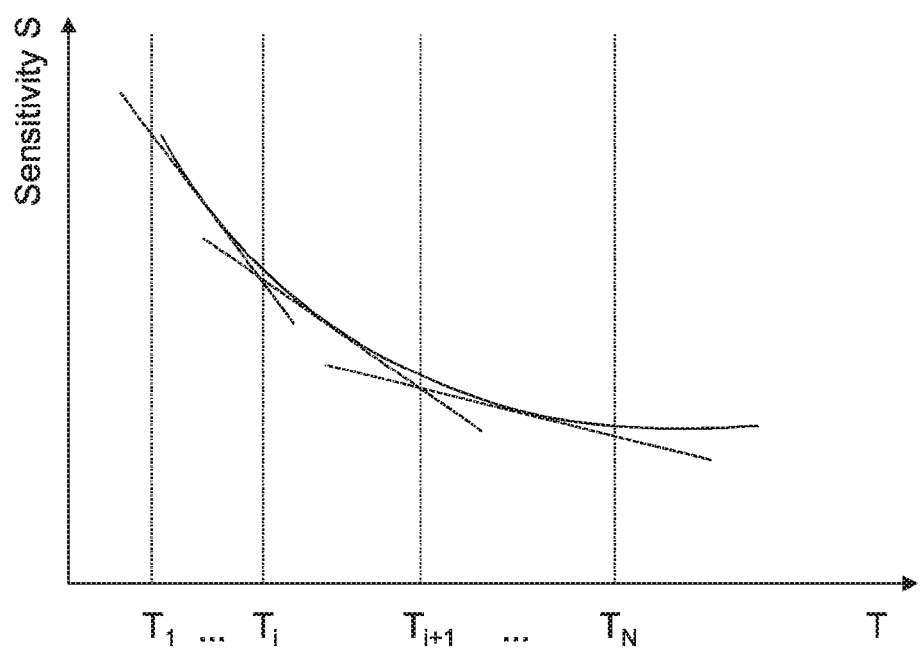
Figure 3:
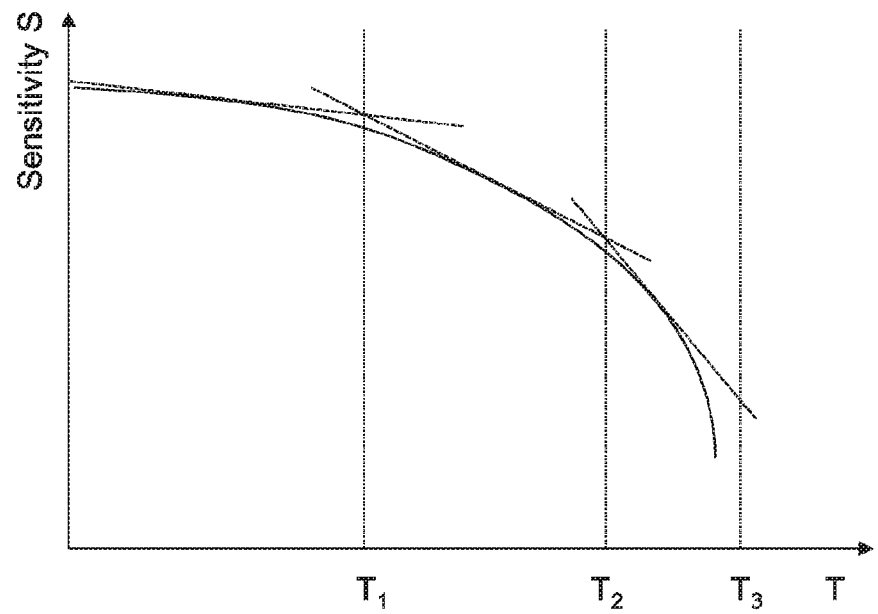
Figure 4:
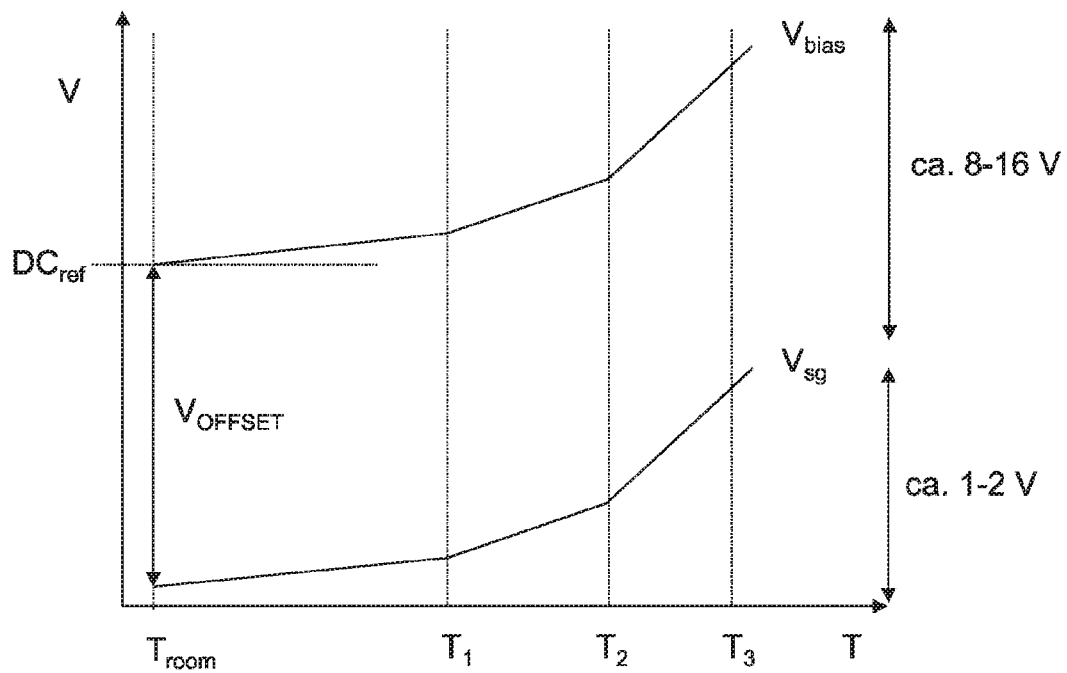
Figure 5:
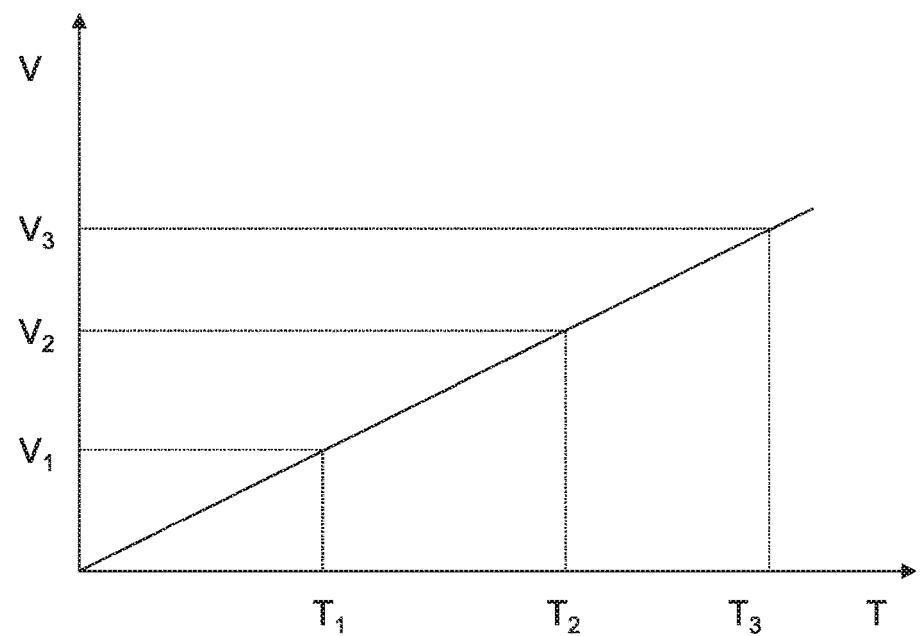
Figure 6:
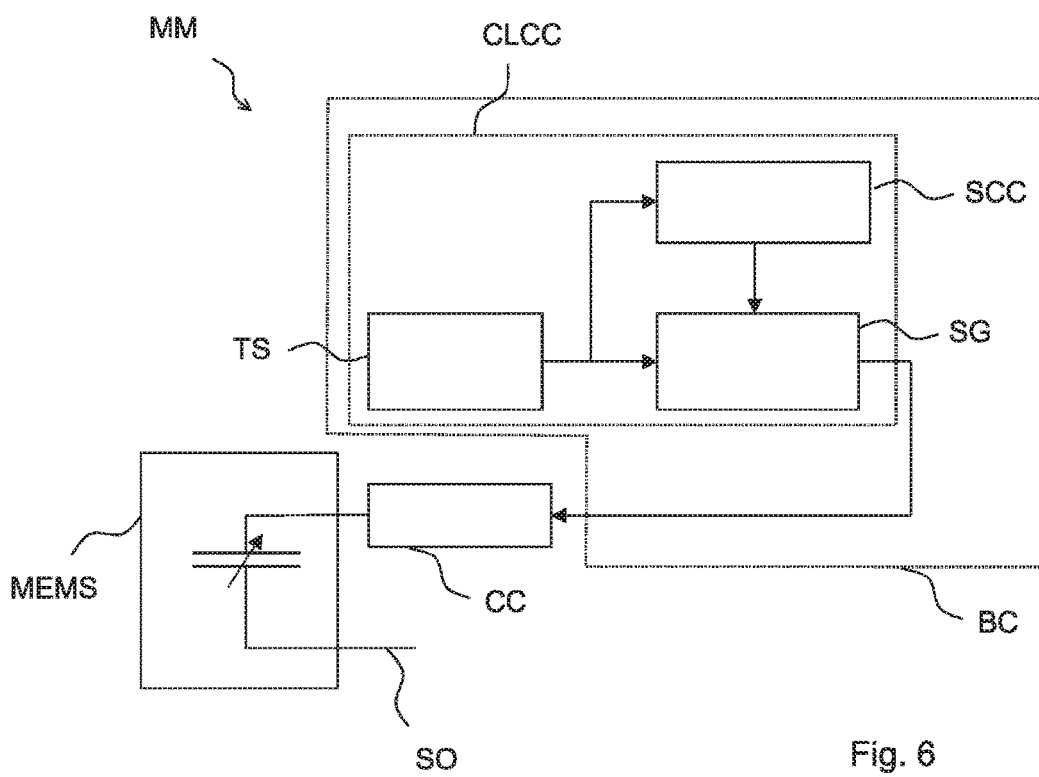
Figure 7:
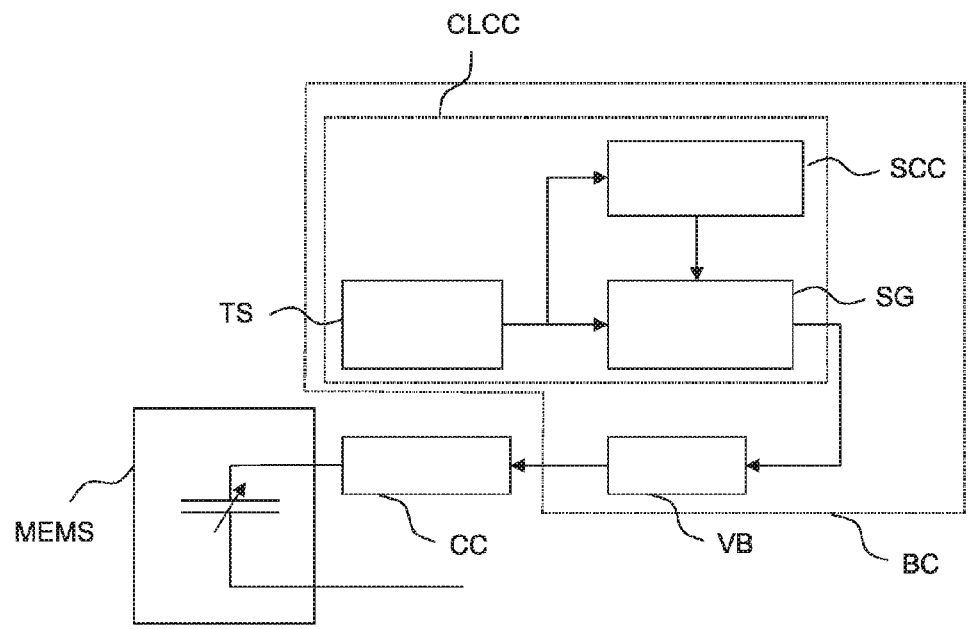
Figure 8:
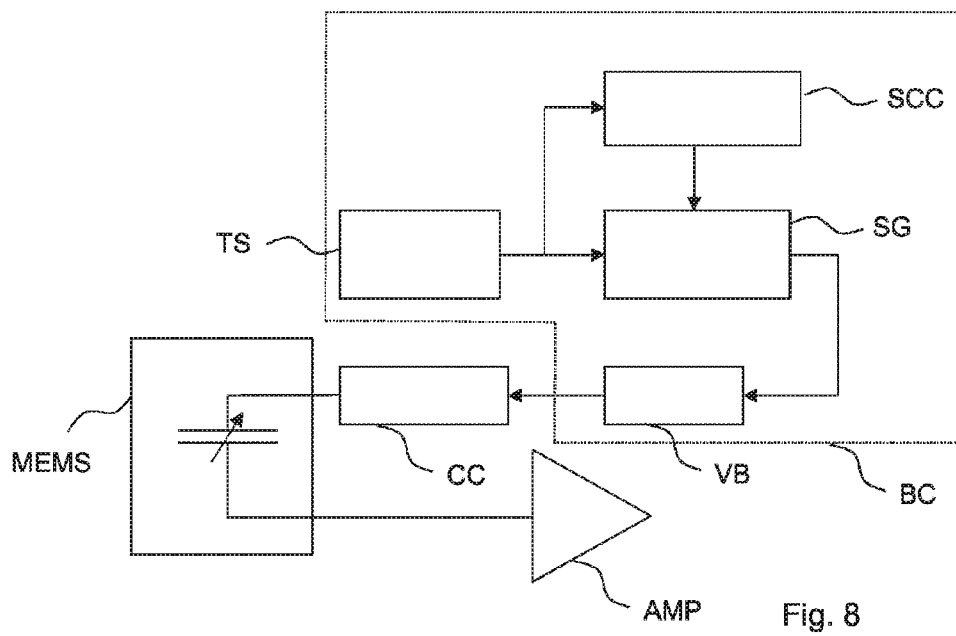
Figure 9:
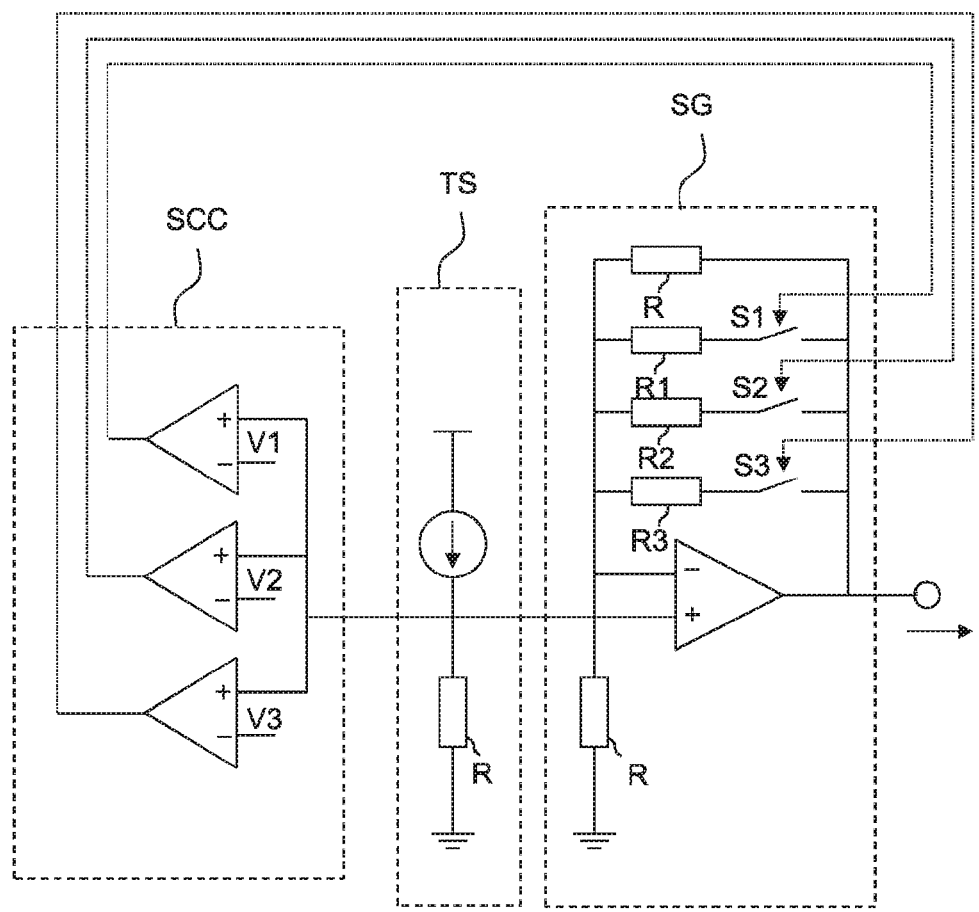
Figure 10:
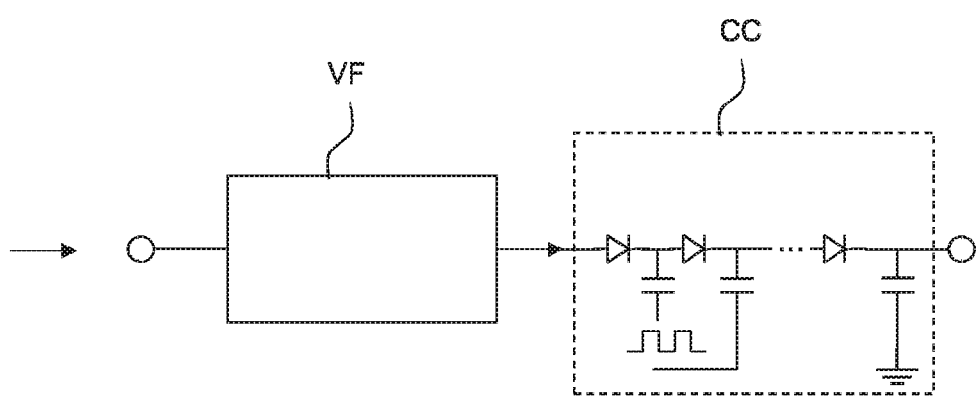

The present invention, basic working principles and preferred embodiments are described in the accompanying drawings, wherein FIG. 1 shows a basic equivalent circuit diagram of the microphone, FIG. 2 shows a possible temperature dependent sensitivity curve with decreasing slope, FIG. 3 shows a possible temperature dependent sensitivity curve with increasing absolute value of the sensitivity, FIG. 4 shows different piece-wise linear segments of the voltage generated by the slope generator $V_{sg}$ and the bias voltage $V_{bias}$. The bias voltage may be the sum of the voltage generated by the slope generator and an offset voltage, FIG. 5 shows a possible output of a temperature sensor providing a PTAT voltage, FIG. 6 shows a more detailed equivalent circuit diagram of the microphone where the bias circuit comprises a temperature sensor, a slope control circuit and a slope generator within the closed loop control circuit, FIG. 7 shows another embodiment further comprising a voltage buffer in the bias circuit, FIG. 8 shows another embodiment further comprising an amplifier, FIG. 9 shows embodiments of a slope control circuit, a temperature sensor, and a slope generator, FIG. 10 shows a possible embodiment of a charging circuit comprising elements of a charge pump.

FIG. 1 shows an equivalent circuit diagram of the basic embodiment of a MEMS microphone MM. The microphone MM comprises a MEMS capacitor MCAP that may be arranged in a MEMS device, e.g. a MEMS chip MEMS. The microphone further comprises a bias circuit BC and a charging circuit CC. The bias circuit BC provides a control signal controlling the charging circuit CC. The charging circuit CC generates the operation voltage for the MEMS capacitor MCAP and transfers the corresponding electrical charge to the capacitor. The capacitor may comprise two or more electrodes. At least one of the electrodes is connected to a signal output SO where an electrical signal encoding the received audio signal can be obtained for further processing.

The bias circuit BC comprises the closed loop control circuit CLCC creating the control signal controlling the charging circuit. The control signal may be a voltage signal applied to the control circuit CC.

Within the closed loop control circuit, a closed loop circuit monitoring the actual operation temperature and adaptively adjusting the control signal is contained.

FIGS. 2 and 3 show different possible temperature dependent sensitivity curves of a MEMS microphone. In FIG. 2, a sensitivity curve and corresponding piece-wise linear approximations are shown where the sensitivity is reduced with increasing temperature. However, the absolute value of the slope of the sensitivity is reduced with increasing temperature. The threshold temperatures T1, . . . , TN are chosen such that the approximation of the sensitivity curve by the piece-wise linear segments is as good as possible for a given number of threshold temperatures. Thus, at sections where the absolute value of the slope of the temperature dependent sensitivity curve is relatively large, the temperature intervals may be chosen quite narrow. In regions where the absolute value of the slope of the temperature dependent sensitivity curve is quite low, wider temperature intervals can be chosen. Thus, at lower temperatures, the temperature intervals of the approximation in FIG. 2 are narrower than at higher temperatures.

In contrast, FIG. 3 shows the situation where the absolute value of the slope increases with increasing temperature. Correspondingly, the temperature intervals for the piece-wise linear segments can be relatively wide at low temperatures. The width of the temperature intervals may be reduced at higher temperatures.

FIG. 4 shows a possible output $V_{sg}$ of the voltage generated by the slope generator. Depending on the actual operation temperature and the corresponding temperature interval, respectively, a different slope with a different offset is provided. An additional offset voltage $V_{offset}$ may be added to the output of the slope generator to obtain the bias voltage $V_{bias}$ provided to the charging circuit. The additional offset voltage $V_{offset}$ may be in a range between 8 to 16 V where the variation of the voltage generated by the slope generator may be in a range from 1 to 2 V.

FIG. 5 shows the output of a PTAT temperature sensor providing a voltage scaling with the absolute temperature.

FIG. 6 shows an embodiment of a MEMS microphone where the bias circuit BC comprises a closed loop control circuit CLCC with a temperature sensor TS, a slope control circuit SCC, and a slope generator SG. The temperature sensor TS provides a temperature signal, e.g. a voltage being proportional to the absolute temperature, to the slope control circuit SCC and to the slope generator SG. The slope control circuit SCC provides one or a plurality of control signals to the slope generator SC.

The output of the slope generator SC may be routed to the charging circuit CC. The signal provided to the charging circuit CC may be a control voltage $V_{sc}$ or a control voltage $V_{sg}$ in addition to an additional offset voltage $V_{offset}$.

FIG. 7 shows a more detailed embodiment of the closed loop control circuit CLCC as the output of the slope generator SC is connected to a voltage buffer VB which feeds a control signal to the charging circuit CC. However, the voltage buffer is optional and can be omitted.

FIG. 8 shows another embodiment where the output of the MEMS capacitor is connected to an amplifier AMP. The amplifier AMP may be integrated into an ASIC chip together with other circuit components of the bias circuit and/or the charging circuit. The voltage buffer shown in FIG. 8 is optional and can be omitted.

FIG. 9 illustrates the closed loop of the closed loop control circuit. The temperature sensor TS may provide a voltage generating element generating a voltage proportional to absolute temperature which may be connected to ground via a resistor R. Further, the output of the PTAT voltage generating element may be connected to the slope control circuit SCC and to the slope generator SC. The slope control circuit comprises a plurality of comparators where the embodiment presented in FIG. 9 has three comparators. Each comparator has two inputs where one of the two inputs is an inverted input. The non-inverted inputs of the comparators are connected to the temperature sensor TS. The output of each comparator is fed via a corresponding signal line to a switch of the slope generator. The slope generator comprises a plurality of serial connections of a resistive element and a switch. The embodiment shown in FIG. 9 comprises three serial connections where the first serial connection has a resistor R1 and a switch S1. The second serial connection has a resistor R2 and a switch S2 and the third serial connection has a resistor R3 and a switch S3. Further, the slope generator has an additional resistive element connected in parallel to the serial connections and a further additional element connected to ground. Connected in parallel to the serial connections, a comparator is comprised in the slope generator SG. The inverted input of the comparator is connected to the serial connections, i.e. to the resistor's side of the serial connections while the non-inverted input of the comparator is connected to the temperature sensor TS.

Reference voltages, e.g. reference voltages V1, V2, V3 in FIG. 9, are applied to the inverted input of the comparators of the slope control circuits. The references voltages V1, V2, V3 are compared to the voltage provided by the temperature sensor TS. Depending on the actual temperature, the voltage provided by the temperature sensor TS causes a certain number of the comparators of the slope control circuit to create an activation signal activating the corresponding switch of the slope generator. Thus, the switching state of the switches of the slope generator depends on the temperature and on the reference voltages applied to the slope control circuit. Accordingly, the output voltage $V_{sg}$ as shown in FIG. 4 with piece-wise linear segments can be obtained.

FIG. 10 shows a possible implementation of the charging circuit CC which may be realized as a Dickson charge pump comprising a serial connection of basic elements, each comprising a diode and a storage capacitor. Between the output of the slope generator SC and the input of the charging device CC, a further voltage follower VF may be provided. The output of the charging circuit CC may be connected to one or more electrodes of the MEMS capacitor.

The present MEMS microphone is not limited to the embodiments described above or shown in the figures. Microphones comprising further circuit elements such as further amplifier circuits or a higher number of comparators or serial connections in the slope control circuit and in the slope generator, respectively, are also comprised by the present invention.

LIST OF REFERENCE SIGNS

AMP: amplifier
BC: bias circuit
CC: charging circuit
CLCC: closed loop control circuit
MCAP: MEMS capacitor
MEMS: MEMS component comprising the MEMS capacitor
MM: MEMS microphone
R: resistor
R1, R2, R3: resistor
S: sensitivity
S1, S2, S3: switch
SCC: slope control circuit
SG: slope generator
SO: signal output
T: temperature
$T_1, T_2, \ldots, T_N$: threshold temperature
TS: temperature sensor
V: voltage
$V_1, V_2, V_3$: reference voltages
VB: voltage buffer
$V_{bias}$ bias voltage controlling the charging circuit
$V_{offset}$ offset voltage
$V_{sg}$: output voltage of a slope generator

The invention claimed is:

1. MEMS microphone with improved sensitivity, comprising
a MEMS capacitor with a variable capacitance,
a charging circuit provided for charging the MEMS capacitor,
a bias circuit provided for creating a bias voltage $V_{bias}$ applied to the charging circuit, where
the bias circuit comprises a closed loop control circuit and
the bias voltage $V_{bias}$ has a temperature dependence.

2. MEMS microphone according to claim 1, where the bias voltage $V_{bias}$ has a piecewise linear temperature dependence.

3. MEMS microphone according to claim 1, where the closed loop control circuit comprises a temperature sensor.

4. MEMS microphone according to claim 3, where the temperature sensor provides a Proportional To Absolute Temperature (PTAT) voltage $V_{sen}$.

5. MEMS microphone according to claim 1, where the closed loop control circuit comprises a slope generator.

6. MEMS microphone according to claim 5, where the slope generator comprises a comparator and a plurality of serial connections of a resistor and a switch.

7. MEMS microphone according to claim 1, where the closed loop control circuit comprises a slope control circuit.

8. MEMS microphone according to claim 7, where the slope control circuit comprises a plurality of comparators.

9. MEMS microphone according to claim 1, where the charging circuit comprises a charge pump.

10. MEMS microphone according to claim 5, where
the slope generator generates a linear voltage $V_{sg}$ and
a slope of $V_{sg}$ is mainly proportional to the negative slope of the temperature dependence of the sensitivity of the microphone, —S(T), at a given temperature.

11. MEMS microphone according to claim 1, where the bias voltage is the sum of a plurality of voltages selected from a plurality of temperature independent voltages and temperature dependent voltages.

12. MEMS microphone according to claim 1, where the bias circuit is a part of an ASIC of the MEMS microphone.

13. MEMS microphone according to claim 1, further comprising a non-volatile memory element for storing linearity parameters.

14. MEMS microphone with improved sensitivity, comprising
   a MEMS capacitor with a variable capacitance,
   a charging circuit provided for charging the MEMS capacitor,
   a bias circuit provided for creating a bias voltage $V_{bias}$ applied to the charging circuit, where
   the bias circuit comprises a closed loop control circuit,
   the bias voltage $V_{bias}$ has a temperature dependence, and where the bias voltage $V_{bias}$ has a piecewise linear temperature dependence.

15. MEMS microphone with improved sensitivity, comprising
   a MEMS capacitor with a variable capacitance,
   a charging circuit provided for charging the MEMS capacitor,
   a bias circuit provided for creating a bias voltage $V_{bias}$ applied to the charging circuit, where
   the bias circuit comprises a closed loop control circuit which comprises a slope generator, and
   the bias voltage $V_{bias}$ has a temperature dependence.

* * * * *